(12) United States Patent
Cheng et al.

(10) Patent No.: US 12,256,582 B2
(45) Date of Patent: Mar. 18, 2025

(54) DISPLAY PANEL, MANUFACTURING METHOD AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Rui Cheng, Beijing (CN); Yunpeng Zhang, Beijing (CN); Lele Sun, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 469 days.

(21) Appl. No.: 17/770,253

(22) PCT Filed: Jun. 10, 2021

(86) PCT No.: PCT/CN2021/099355
§ 371 (c)(1),
(2) Date: Apr. 19, 2022

(87) PCT Pub. No.: WO2021/254242
PCT Pub. Date: Dec. 23, 2021

(65) Prior Publication Data
US 2022/0393085 A1 Dec. 8, 2022

(30) Foreign Application Priority Data
Jun. 17, 2020 (CN) .......................... 202010553939.6

(51) Int. Cl.
*H10H 20/857* (2025.01)
*G06F 3/041* (2006.01)
*H10H 20/01* (2025.01)

(52) U.S. Cl.
CPC ......... *H10H 20/857* (2025.01); *G06F 3/0412* (2013.01); *H10H 20/01* (2025.01); *H10H 20/0364* (2025.01)

(58) Field of Classification Search
CPC .................. H01L 33/62; H01L 33/005; H01L 2933/0066; G06F 3/0412
See application file for complete search history.

(56) References Cited

U.S. PATENT DOCUMENTS

| 9,715,298 B2 | 7/2017 | Hong et al. |
| 2014/0182894 A1 | 7/2014 | Liu et al. |

(Continued)

FOREIGN PATENT DOCUMENTS

| CN | 203250289 U | 10/2013 |
| CN | 105469731 A | 4/2016 |

(Continued)

OTHER PUBLICATIONS

CN 202010553939.6 first office action.
PCT/CN2021/099355 international search report and written opinion.

*Primary Examiner* — Monica D Harrison
*Assistant Examiner* — Andre C Stevenson
(74) *Attorney, Agent, or Firm* — IPro, PLLC

(57) ABSTRACT

The present disclosure provides a display panel, a manufacturing method thereof and a display device. The display panel includes: a base substrate including a display region, a wiring region surrounding the display region and a bonding region located at a side of the display region; a light-emitting element arranged in the display region and including a cathode; and a first line and at least one second line in the wiring region, the first line being coupled to the cathode of the light-emitting element, two ends of the second line being coupled to the first line in the bonding region, and the (Continued)

first line and the second line being coupled through at least two via holes at an opposite side of the bonding region.

18 Claims, 4 Drawing Sheets

(56) References Cited

U.S. PATENT DOCUMENTS

| | | |
|---|---|---|
| 2017/0221421 A1 | 8/2017 | Wang et al. |
| 2020/0273919 A1* | 8/2020 | Ding .................... G06F 3/0446 |
| 2021/0210587 A1 | 7/2021 | Zhu et al. |
| 2022/0005989 A1 | 1/2022 | Ban et al. |
| 2022/0140277 A1* | 5/2022 | Yang ................ H10K 59/80521 |
| | | 257/40 |

FOREIGN PATENT DOCUMENTS

| | | | |
|---|---|---|---|
| CN | 109037273 | A | 12/2018 |
| CN | 110061147 | * | 7/2019 |
| CN | 110061147 | A | 7/2019 |
| CN | 110930931 | A | 3/2020 |
| CN | 110972495 | A | 4/2020 |
| CN | 210575959 | * | 5/2020 |
| CN | 210575959 | U | 5/2020 |
| CN | 111653600 | A | 9/2020 |

* cited by examiner

DISPLAY PANEL, MANUFACTURING METHOD AND DISPLAY DEVICE

CROSS-REFERENCE TO RELATED APPLICATION

This application is the U.S. national phase of PCT Application No. PCT/CN2021/099355 filed on Jun. 10, 2021, which claims a priority of the Chinese patent application No. 202010553939.6 filed on Jun. 17, 2020, which is incorporated herein by reference in its entirety.

TECHNICAL FIELD

The present disclosure relates to the field of display technology, in particular to a display panel, a manufacturing method thereof and a display device.

BACKGROUND

With an increasing demand on flexible screen integration, an On-Cell technology has gradually become a mainstream technology. Compared with a conventional flexible screen, a sensor with a touch function is arranged on a panel, so as to provide a higher product integration level, a thinner screen, a narrower bezel and better user experience.

SUMMARY

In one aspect, the present disclosure provides in some embodiments a display panel, including: a base substrate including a display region, a wiring region surrounding the display region and a bonding region located at a side of the display region; a light-emitting element arranged in the display region and including a cathode; and a first line and at least one second line in the wiring region, the first line being coupled to the cathode of the light-emitting element, two ends of the second line being coupled to the first line in the bonding region, and the first line and the second line being coupled through at least two via holes at an opposite side of the bonding region.

In a possible embodiment of the present disclosure, the display panel further includes two first PINs in the bonding region, the two first PINs are coupled to the two ends of the second line respectively during an aging test, and a voltage applied through the two first PINs is the same as a voltage applied to the first line.

In a possible embodiment of the present disclosure, the display panel further includes two second PINs in the bonding region, and the second PIN is configured to apply a voltage to the first line during the aging test.

In a possible embodiment of the present disclosure, a part of an upper surface of the first line in the wiring region at the opposite side of the bonding region is covered by a packaging layer, and the second line is coupled to a part of the first line not covered by the packaging layer.

In a possible embodiment of the present disclosure, the second line in other wiring regions except a side where the bonding region is located and the opposite side of the bonding region is arranged at a same layer as the first line and is located at a side of the first line away from the display region.

In a possible embodiment of the present disclosure, the second line in other wiring regions except a side where the bonding region is located and the opposite side of the bonding region is arranged at a different layer from the first line.

In a possible embodiment of the present disclosure, the display panel further includes a touch layer located on the light-emitting element, and the second line is arranged at a same layer and made of a same material as the touch layer.

In a possible embodiment of the present disclosure, the at least two via holes are spaced apart from each other equally in the wiring region at the opposite side of the bonding region.

In a possible embodiment of the present disclosure, the first line is a VSS line.

In another aspect, the present disclosure further provides in some embodiments a method for manufacturing a display panel, including: providing a base substrate, the base substrate including a display region, a wiring region surrounding the display region and a bonding region, and the bonding region being located at a side of the display region; forming a first line in the wiring region on the base substrate; forming a light-emitting element in the display region at a side of the first line away from the base substrate, the light-emitting element including a cathode, and the first line being coupled to the cathode of the light-emitting element; and forming at least one second line in the wiring region, two ends of the second line being coupled to the first line in the bonding region, and the first line and the second line being coupled through at least two via holes at an opposite side of the bonding region.

In a possible embodiment of the present disclosure, the forming the at least one second line in the wiring region includes forming a touch layer and the second line simultaneously with a same mask through a single patterning process.

In a possible embodiment of the present disclosure, subsequent to forming the first line in the wiring region on the base substrate, the method further includes forming a packaging layer at a side of the first line away from the base substrate. Prior to forming the at least one second line in the wiring region, the method further includes forming at least two via holes in the wiring region at the opposite side of the bonding region through a patterning process and forming a part of the first line not covered by the packaging layer. The forming the at least one second line in the wiring region includes forming the second line on the part of the first line not covered by the packaging layer.

In a possible embodiment of the present disclosure, the at least two via holes are spaced apart from each other equally in the wiring region at the opposite side of the bonding region.

In a possible embodiment of the present disclosure, the method further includes, after an aging test has been completed on the display panel, cutting off a layered structure including the second line of the display panel beyond a side where the bonding region is located and the opposite side of the bonding region to form a narrow-bezel display panel.

In yet another aspect, the present disclosure further provides in some embodiments a display device including the above-mentioned display panel.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

During the manufacture of a display device, an aging test needs to be performed on the display device to eliminate bright spots and light leakage caused by a leakage current of a positive channel Metal Oxide Semiconductor (PMOS), and a large current is used to quickly stabilize a service life of Red/Green/Blue (R/G/B) materials to eliminate ghosts and other adverse effects. During the aging test, it is necessary to make a compromise between an aging test effect and an applied current/voltage. If the current/voltage is too large, a risk of burning may occur for a region where a power source line is narrowed, and if the current/voltage is too small, the weak bright spots may not be eliminated completely or the ghost may still exist, i.e., a display effect may be adversely affected.

Figure 1:
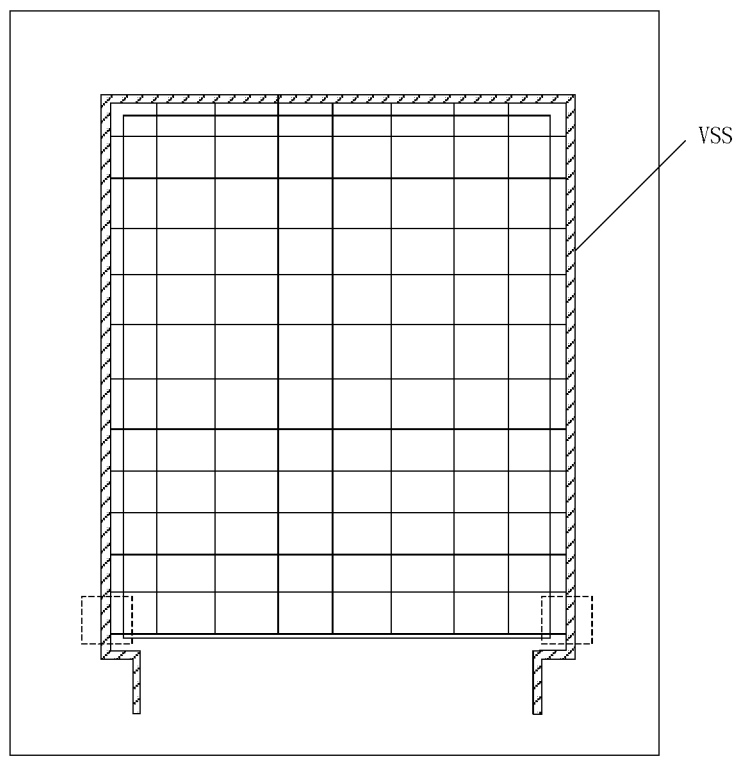
FIG. 1 is a schematic view showing a design of a VSS line in the related art.

FIG. 1 shows a VSS line in the related art. As shown in FIG. 1, in the design of the VSS power source line in the related art, a cathode surface of the light-emitting element is lapped onto the peripheral VSS power source line to provide power to the light-emitting element. In this design, a current flowing through all the light-emitting elements in the display region is converged at the cathode and then flows to the VSS power source line, and eventually flows back to a Pad region, that is, the current is most concentrated at the VSS power source line in the Pad region (a region indicated by a dotted box in FIG. 1), and the entire current of the product is collected at this position. Furthermore, during the aging test, a current which is twice to three times of a current for normal display needs to be applied to the display device, so that the current in the current concentration region of the VSS power source line will be twice or three times of the current for the normal display. At this time, a huge quantity of heat is generated, and the risk of burning in the current concentration region during the aging test is extremely high. A risk level is linearly positively correlated with a display size of the display device and the power consumption of the product, so a yield of the product may be adversely affected.

However, if a smaller current is applied during the aging test to avoid the burning, some weak bright spots may not be eliminated completely or the ghost may occur, i.e., the display effect may be adversely affected.

Figure 2A:
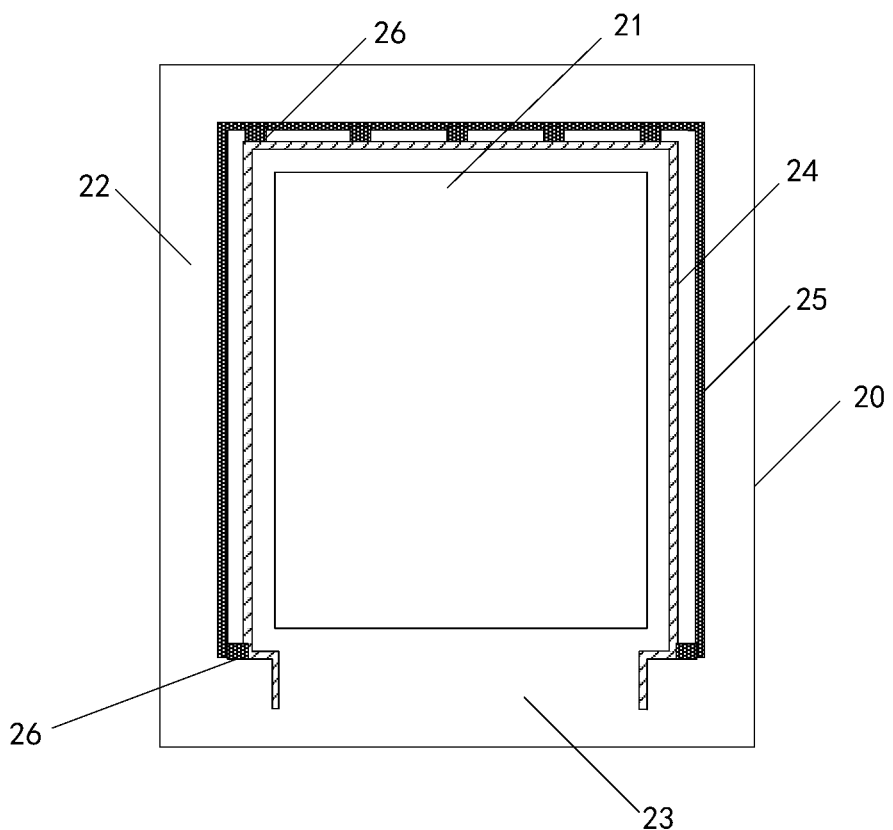
FIG. 2a is a schematic view showing a display panel according to one embodiment of the present disclosure.

As shown in FIG. 2a, the present disclosure provides in some embodiments a display panel. The display panel includes a base substrate 20, which includes a display region 21, a wiring region 22 surrounding the display region 21 and a bonding region 23, and the bonding region 23 is located at a side of the display region 21.

In the embodiments of the present disclosure, as shown in FIG. 2a, the wiring region 22 is of a door shape and surrounds the display region 21. In the embodiments of the present disclosure, the bonding region 23 is located at a notch of the door-shape wiring region 22.

In the embodiments of the present disclosure, a light-emitting element for emitting light is arranged in the display region 21, and a driving integrated circuit is arranged in the bonding region 23. A first line 24 and at least one second line 25 are arranged in the door-shape wiring region 22, the first line 24 and the second line 25 are both of a door shape, and the first line 24 is coupled to a cathode of the light-emitting element. A current supplied to the light-emitting element flows into an anode of the light-emitting element, through a light-emitting material layer and to the cathode of the light-emitting element, and is finally converged at the first line 24. Two ends of the second line 25 are coupled to the first line 24 in the bonding region 23, and the first line 24 and the second line 25 are coupled through at least two via holes 26 at an opposite side of the bonding region 23.

In other words, the first line 24 is coupled in parallel to the second line 25, and two ends of the second line 25 are coupled to the first line 24 at a corner of the bonding region 23 close to the display region. In addition, the first line 24 and the second line 25 are coupled through at least two via holes 26 at the opposite side of the bonding region 23 (a side away from the bonding region 23, i.e., a side opposite to a side where the bonding regions located), so as to enable the current flowing from the cathode of the light-emitting element to the first line 24 to flow through the second line 25 to the bonding region through the via holes 26, thereby to achieve a shunting effect on the current. In this way, it is able to reduce the current flowing through the first line 24 and reduce the risk of burning at the corner in the aging test, thereby to make a compromise between the product yield and the aging test effect.

Figure 2B:
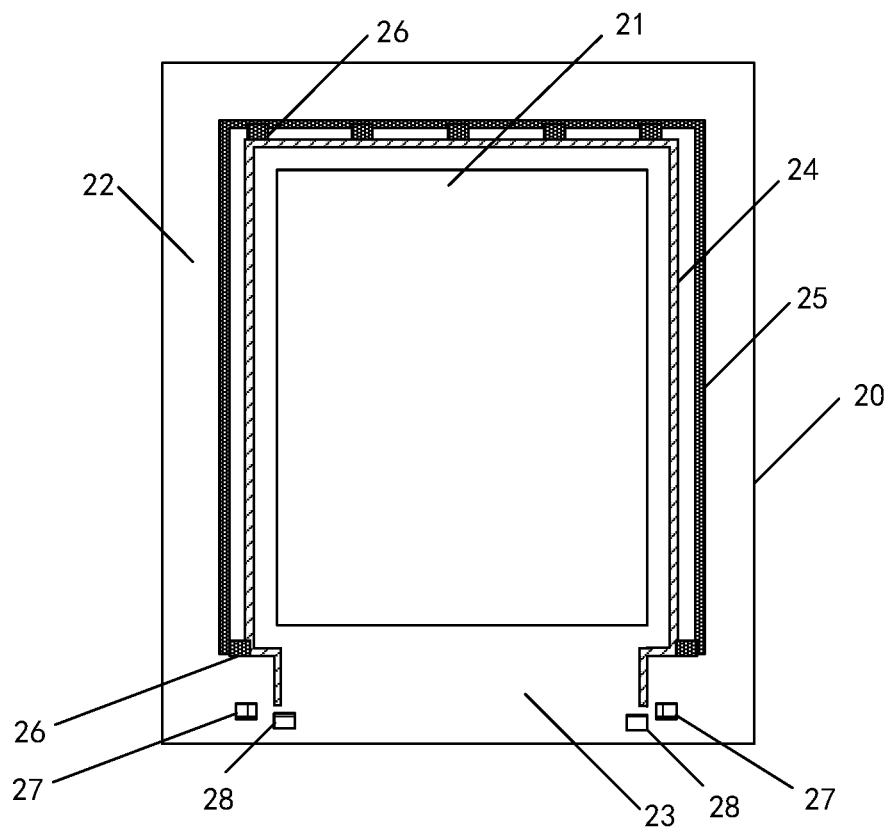
FIG. 2b is another schematic view showing the display panel according to one embodiment of the present disclosure.

In the embodiments of the present disclosure, as shown in FIG. 2b, the display panel further includes two first PINs 27 in the bonding region 23. The two first PINs 27 are coupled to the two ends of the second line respectively during the aging test, and a voltage applied through the two first PINs 27 is the same as a voltage applied to the first line.

In the embodiments of the present disclosure, the display panel further includes two second PINs 28 arranged in the bonding region and configured to apply a voltage to the first line during the aging test.

In the embodiments of the present disclosure, during the aging test, a voltage is applied to the first line 24 through the two second PINs 28, and a same voltage as the voltage to the first line 24 is applied to the second line 25 through the two first PINs 27. In this regard, during the aging test, as compared with the related art where a current which is twice or three times of a current for normal display is applied to the first line, for the display panel in the embodiments of the present disclosure, the current flows back to the bonding region 23 through the first line 24 and the second line 25 to achieve the shunting effect on the current, so it is able to reduce the current flowing through the first line 24 and reduce the risk of burning at the corner in the aging test, thereby to make a compromise between the product yield and the aging test effect.

In the embodiments of the present disclosure, a driving integrated circuit is further arranged in the bonding region. When an image is displayed by the display panel, the first line is coupled to the driving integrated circuit to provide a current required for display.

Figure 3:
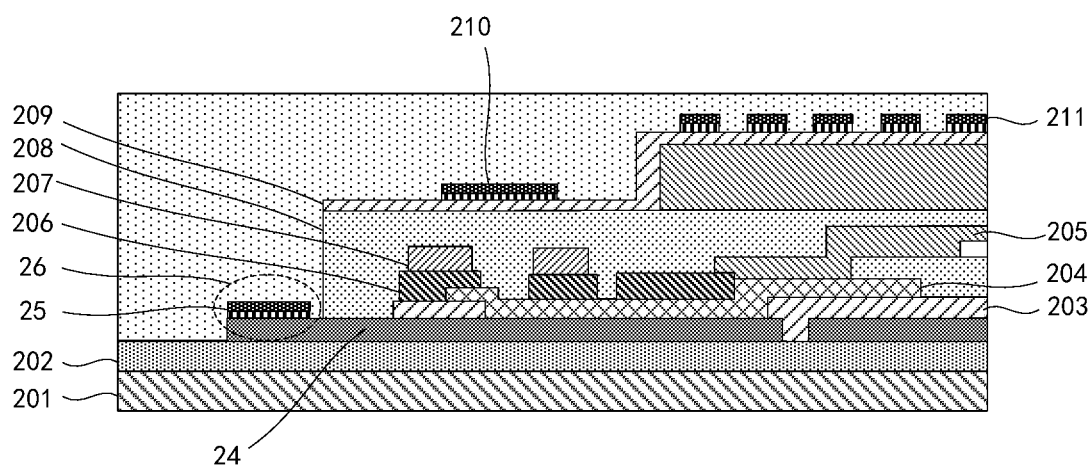
FIG. 3 is a schematic view showing a situation where a second line is lapped onto a first line in a wiring region at an opposite side of a bonding region according to one embodiment of the present disclosure.

FIG. 3 shows the connection between the second line and the first line in the wiring region at the opposite side of the bonding region according to the embodiments of the present disclosure.

As shown in FIG. 3, the first line 24 and the second line 25 are coupled through at least two via holes 26 in a part of the wiring region 22 at the opposite side of the bonding region 23.

To be specific, the base substrate 20 includes a substrate 201 and a buffer layer 202 arranged on the substrate 201, the first line 24 is arranged on the base substrate 20 in a part of the wiring region 22 at the opposite side of the bonding region 23, an interlayer insulation layer 203 and a transfer pattern 204 are arranged on the first line 24, and a pixel definition layer 206, a spacer layer 207, a first packaging layer 208, and a second packaging layer 209 are laminated one on another on the transfer pattern 204. As shown in FIG. 3, a part of an upper surface of the first line 24 is covered by the first packaging layer 208 on the first line 24, and a part of the surface of the first line at the side away from the display region is not covered by the first packaging layer 208.

In the manufacturing process, the first line 24 is formed on the base substrate, and the first packaging layer 208 is formed at a side of the first line 24 away from the base substrate. At this time, the first packaging layer 208 completely covers the first line 24, and then the first packaging layer 208 is patterned through a patterning process to form at least two via holes 26. A part of the surface of the first line 24 is exposed through the at least two via holes 26, and the second line 25 is subsequently formed on the surface not covered by the first packaging layer 208, so that the first line 24 is lapped onto the second line 25.

The cathode 205 of the light-emitting element is coupled to the first line 24 through the transfer pattern 204, and the transfer pattern 204 is made of the same material as the anode of the light-emitting element. A second packaging layer 209 may further be arranged on the first packaging layer 208, and a touch layer 211 and a grounded line 210 may also be arranged on the second packaging layer 209.

Figure 4:
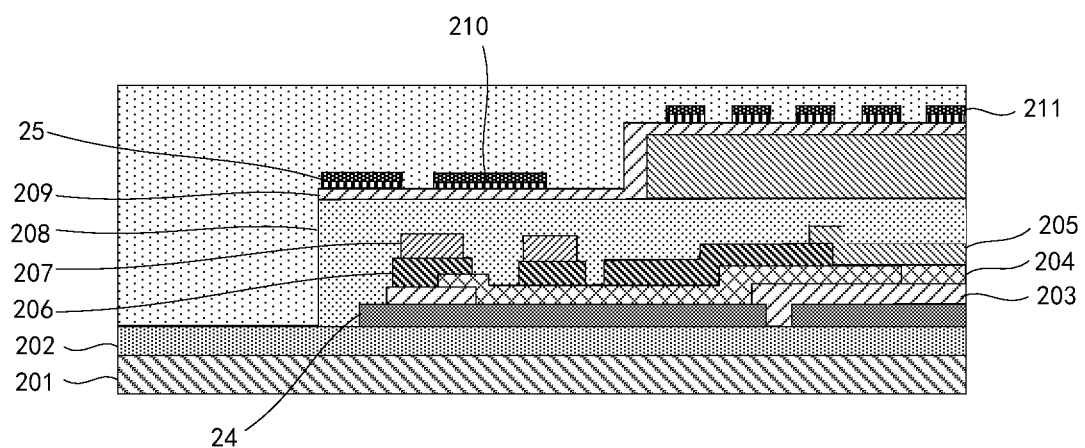
FIG. 4 is a schematic view showing relative position relationship between the second line and the first line in the other wiring regions except a side where the bonding region is located and the opposite side of the bonding region according to one embodiment of the present disclosure.

FIG. 4 shows relative position relationship between the second line and the first line in the other wiring regions except a side where the bonding region is located and the opposite side of the bonding region in the embodiments of the present disclosure. As shown in FIG. 4, in the wiring region 22 except the side where the bonding region is located and the opposite side of the bonding region, the upper surface of the first line 24 on the base substrate 20 is completely covered by the first packaging layer 208, and the second line 25 is located on the second packaging layer 209 and is arranged adjacent to the grounded line 210 on the second packaging layer 209. A safety distance needs to be reserved between the second line 25 and the grounded line 210, and the second line 25 is arranged on the second packaging layer 209 to reduce a segment difference.

In the embodiments of the present disclosure, the display panel further includes the touch layer 211 located on the light-emitting element, and the touch layer 211 is arranged at a same layer and made of a same material as the second line 25.

In other words, the touch layer 211 and the second line 25 are arranged on the second package layer 209, and the touch layer 211 may be a touch layer formed by a single-layer metal line or a double-layer metal line. The second line 25 may be formed in the wiring region simultaneously when a certain layer of metal line of the touch layer 211 is formed, or may have a same double-layer metal structure as the touch layer. Identically, in the regions at both sides of the wiring region 22, the cathode 205 of the light-emitting element is coupled to the first line 24 through the transfer pattern 204, and the transfer pattern 204 is made of a same material as the anode of the light-emitting element.

Figure 5:
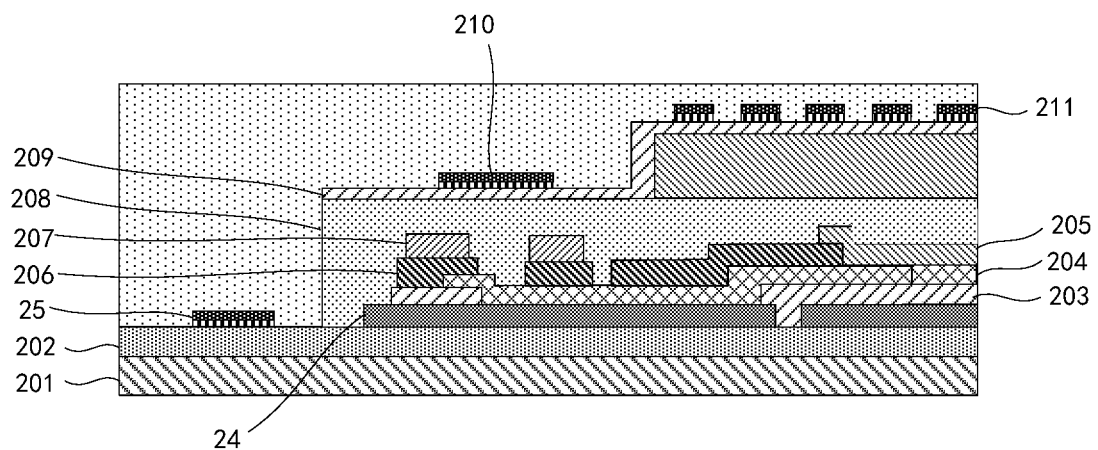
FIG. 5 is another schematic view showing the relative position relationship between the second line and the first line in the other wiring regions except the side where the bonding region is located and the opposite side of the bonding region according to one embodiment of the present disclosure.

FIG. 5 shows another relative position relationship between the second line and the first line in the other wiring regions except a side where the bonding region is located and the opposite side of the bonding region in the embodiments of the present disclosure. As shown in FIG. 5, different from FIG. 4, the first line 24 may be arranged at a same layer as the second line 25 in the wiring region 22 except the side where the bonding region is located and the opposite side of the bonding region, and the second line 25 is located at a side of the first line 24 away from the display region.

To be specific, in the wiring region 22 except the side where the bonding region is located and the opposite side of the bonding region, the upper surface of the first line 24 on the base substrate 20 is completely covered by the first packaging layer 208 on the first line 24, and the second line 25 is located at a side of the first packaging layer 208 away from the display region. Through the above-mentioned line design, it is able to facilitate the narrow-bezel design of the display device. After the aging test has been completed, a layered structure including the second line 25 on both sides of the wiring region 22 (when the display panel is of a rectangular shape) is cut off, so as to achieve the narrow-bezel design while improving the aging test effect and reducing the risk of burning.

In the embodiments of the present disclosure, the at least two via holes 26 are spaced apart from each other equally in the wiring region 22 at the opposite side of the bonding region 23, so as to enable the current to flow from the first line 24 to the second line 25 dispersedly. As shown in FIG. 2, in the embodiments of the present disclosure, five via holes are provided to achieve a better shunting effect.

In the embodiments of the present disclosure, the first line 24 is a VSS line. The anode of the light-emitting element is coupled to a VDD line, and the cathode of the light-emitting element is coupled to the VSS line, so as to provide power to the light-emitting element, thereby to enable the light-emitting element to emit light.

According to the display panel in the embodiments of the present disclosure, through adding the second line, the current flowing through the first line is shunted to effectively reduce a current concentration degree at the first line in the normal display and the aging test process, and avoid the occurrence of burning at a position where the current is too large, thereby to achieve a better aging test effect through a larger current/voltage.

Figure 6:
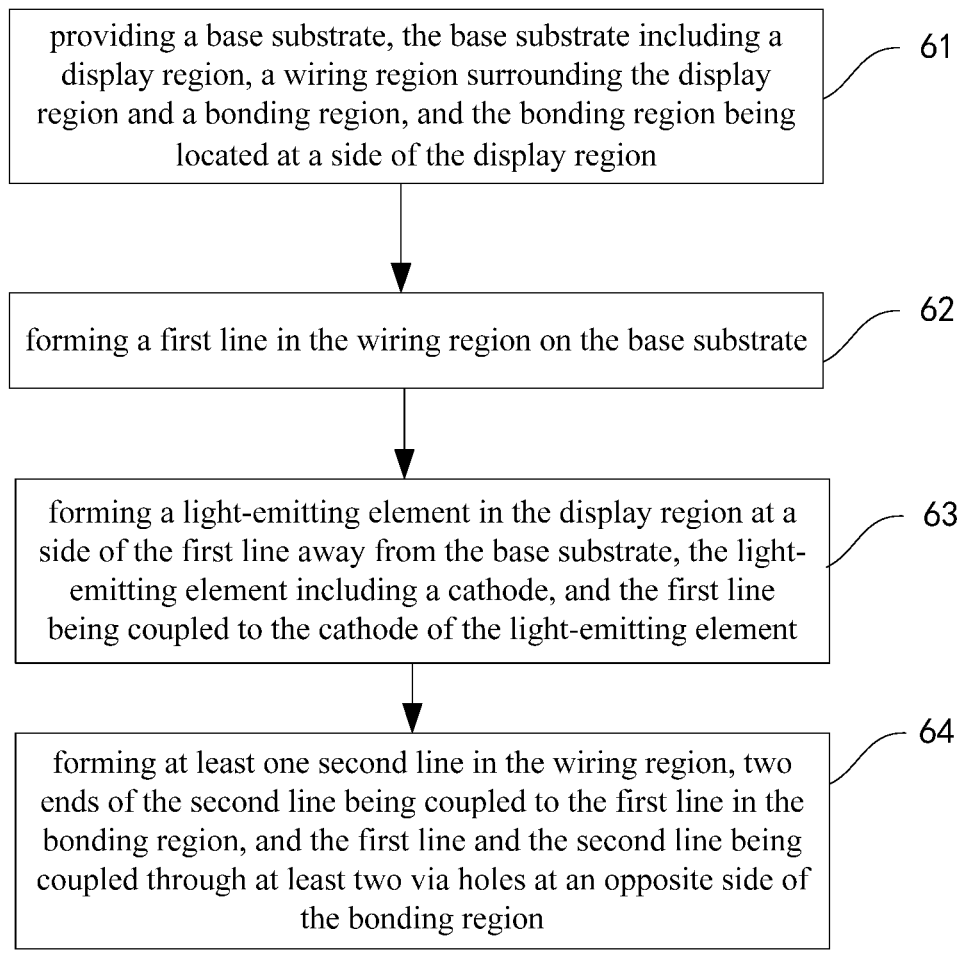
FIG. 6 is a schematic view showing a method for manufacturing the display panel according to one embodiment of the present disclosure.

As shown in FIG. 6, the present disclosure provides in some embodiments a method for manufacturing the above-mentioned display panel, which includes: Step 61 of providing a base substrate, the base substrate including a display region, a wiring region surrounding the display region and a bonding region, and the bonding region being located at a side of the display region; Step 62 of forming a first line in the wiring region on the base substrate; Step 63 of forming a light-emitting element in the display region at a side of the first line away from the base substrate, the light-emitting element including a cathode, and the first line being coupled to the cathode of the light-emitting element; and Step 64 of forming at least one second line in the wiring region, two ends of the second line being coupled to the first line in the bonding region, and the first line and the second line being coupled through at least two via holes at an opposite side of the bonding region.

According to the embodiments of the present disclosure, through adding the second line, the current flowing through the first line is shunted to effectively reduce a current concentration degree at the first line in the normal display and the aging test process, and avoid the occurrence of burning at a position where the current is too large, thereby to achieve a better aging test effect through a larger current/voltage.

In the embodiments of the present disclosure, the forming the at least one second line in the wiring region includes forming a touch layer and the second line simultaneously with a same mask through a single patterning process.

In other words, the display panel manufactured in the embodiments of the present disclosure may also be a touch display panel with a touch function. When the touch layer is formed on the light-emitting element in the display region, the second line in the wiring region may be formed simultaneously, i.e., the touch layer and the second line are formed through a single patterning process. In the case that the touch layer includes at least one layer of the metal line, a certain layer of the metal line in the touch layer is arranged at a same layer and made of a same material as the second line.

In the embodiments of the present disclosure, the at least two via holes are spaced apart from each other equally in the wiring region at the opposite side of the bonding region, so as to enable the current to flow from the first line to the second line dispersedly, thereby to avoid the excessive concentration of the current.

In the embodiments of the present disclosure, subsequent to forming the first line in the wiring region on the base substrate, the method further includes forming a packaging layer at a side of the first line away from the base substrate. Prior to forming the at least one second line in the wiring region, the method further includes forming at least two via holes in the wiring region at the opposite side of the bonding region through a patterning process and forming a part of the first line not covered by the packaging layer. The forming the at least one second line in the wiring region includes forming the second line on the part of the first line not covered by the packaging layer.

Through forming the second line on the part of the first line not covered by the packaging layer, it is able for the first line to be lapped onto the second line.

In the embodiments of the present disclosure, the method further includes, after an aging test has been completed on the display panel, cutting off a layered structure including the second line of the display panel beyond a side where the bonding region is located and the opposite side of the bonding region to form a narrow-bezel display panel.

According to the manufacturing method in the embodiments of the present disclosure, through adding the second line, the current flowing through the first line is shunted to effectively reduce a current concentration degree at the first line in the normal display and the aging test process, and avoid the occurrence of burning at a position where the current is too large, thereby to achieve a better aging test effect through a larger current/voltage.

The present disclosure further provides in some embodiments a display device, which includes the above-mentioned display panel. According to the display panel in the embodiments of the present disclosure, through adding the second line, the current flowing through the first line is shunted to effectively reduce a current concentration degree at the first line in the normal display and the aging test process, and avoid the occurrence of burning at a position where the current is too large, thereby to achieve a better aging test effect through a larger current/voltage. The display device in the embodiments of the present disclosure also has the above-mentioned beneficial effect, which will not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
   a base substrate, comprising a display region, a wiring region surrounding the display region and a bonding region, and the bonding region being located at a side of the display region;
   a light-emitting element arranged in the display region and comprising a cathode;
   a first line and at least one second line in the wiring region, the first line being coupled to the cathode of the light-emitting element, two ends of the second line being coupled to the first line in the bonding region, and the first line and the second line being coupled through at least two via holes at an opposite side of the bonding region; and
   a touch layer located on the light-emitting element, wherein the second line is arranged at a same layer and made of a same material as the touch layer, and the touch layer and the second line are forming simultaneously with a same mask through a single patterning process.

2. The display panel according to claim 1, further comprising two first PINs in the bonding region, wherein the two first PINs are coupled to the two ends of the second line respectively during an aging test, and a voltage applied through the two first PINs is the same as a voltage applied to the first line.

3. The display panel according to claim 2, further comprising two second PINs in the bonding region, wherein the second PIN is configured to apply a voltage to the first line during the aging test.

4. The display panel according to claim 1, wherein a part of an upper surface of the first line in the wiring region at the opposite side of the bonding region is covered by a packaging layer, and the second line is coupled to a part of the first line not covered by the packaging layer.

5. The display panel according to claim 1, wherein the second line in other wiring regions except a side where the bonding region is located and the opposite side of the bonding region is arranged at a same layer as the first line and is located at a side of the first line away from the display region.

6. The display panel according to claim 1, wherein the second line in other wiring regions except a side where the bonding region is located and the opposite side of the bonding region is arranged at a different layer from the first line.

7. The display panel according to claim 1, wherein the at least two via holes are spaced apart from each other equally in the wiring region at the opposite side of the bonding region.

8. The display panel according to claim 1, wherein the first line is a VSS line.

9. A display device, comprising the display panel according to claim 1.

10. The display device according to claim 9, wherein the display device further comprises two first PINs in the bonding region, wherein the two first PINs are coupled to the two ends of the second line respectively during an aging test, and a voltage applied through the two first PINs is the same as a voltage applied to the first line.

11. The display device according to claim 10, wherein the display device further comprises two second PINs in the bonding region, wherein the second PIN is configured to apply a voltage to the first line during the aging test.

12. The display device according to claim 9, wherein a part of an upper surface of the first line in the wiring region at the opposite side of the bonding region is covered by a packaging layer, and the second line is coupled to a part of the first line not covered by the packaging layer.

13. The display device according to claim 9, wherein the second line in other wiring regions except a side where the bonding region is located and the opposite side of the bonding region is arranged at a same layer as the first line and is located at a side of the first line away from the display region.

14. The display device according to claim 9, wherein the second line in other wiring regions except a side where the bonding region is located and the opposite side of the bonding region is arranged at a different layer from the first line.

15. A method for manufacturing a display panel, comprising:
providing a base substrate, the base substrate comprising a display region, a wiring region surrounding the display region and a bonding region, and the bonding region being located at a side of the display region;
forming a first line in the wiring region on the base substrate;
forming a light-emitting element in the display region at a side of the first line away from the base substrate, the light-emitting element comprising a cathode, and the first line being coupled to the cathode of the light-emitting element; and
forming at least one second line in the wiring region, two ends of the second line being coupled to the first line in the bonding region, and the first line and the second line being coupled through at least two via holes at an opposite side of the bonding region;
wherein the forming the at least one second line in the wiring region comprises forming a touch layer and the second line simultaneously with a same mask through a single patterning process.

16. The method according to claim 15, wherein subsequent to forming the first line in the wiring region on the base substrate, the method further comprises forming a packaging layer at a side of the first line away from the base substrate; prior to forming the at least one second line in the wiring region, the method further comprises forming at least two via holes in the wiring region at the opposite side of the bonding region through a patterning process and forming a part of the first line not covered by the packaging layer; and the forming the at least one second line in the wiring region comprises forming the second line on the part of the first line not covered by the packaging layer.

17. The method according to claim 15, wherein the at least two via holes are spaced apart from each other equally in the wiring region at the opposite side of the bonding region.

18. The manufacturing method of the display panel according to claim 15, further comprising, after an aging test has been completed on the display panel, cutting off a layered structure comprising the second line of the display panel beyond a side where the bonding region is located and the opposite side of the bonding region to form a narrow-bezel display panel.

* * * * *